(12) United States Patent
Gardner et al.

(10) Patent No.: US 6,323,519 B1
(45) Date of Patent: *Nov. 27, 2001

(54) ULTRATHIN, NITROGEN-CONTAINING MOSFET SIDEWALL SPACERS USING LOW-TEMPERATURE SEMICONDUCTOR FABRICATION PROCESS

(75) Inventors: Mark I. Gardner, Cedar Creek; Derick J. Wristers; Charles E. May, both of Austin, all of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/177,871

(22) Filed: Oct. 23, 1998

(51) Int. Cl.[7] .......................... H01L 29/76; H01L 29/94; H01L 31/062; H01L 31/113; H01L 31/119

(52) U.S. Cl. .................. 257/336; 257/408; 257/411; 438/305; 438/303

(58) Field of Search .................. 257/336, 408, 257/411, 410; 438/305, 303, 261, 287

(56) References Cited

U.S. PATENT DOCUMENTS

| | | | |
|---|---|---|---|
| 4,743,564 | 5/1988 | Sato et al. | 437/24 |
| 4,908,326 | 3/1990 | Ma et al. | 437/44 |
| 5,089,865 | 2/1992 | Mitsui et al. | 357/23.4 |
| 5,324,974 | 6/1994 | Liao | 257/344 |
| 5,334,870 | 8/1994 | Katada et al. | 257/371 |
| 5,648,284 | 7/1997 | Kusunoki et al. | 437/40 GS |
| 5,714,413 * | 2/1998 | Brigham et al. | 438/301 |
| 5,719,425 | 2/1998 | Akram et al. | 257/344 |
| 5,736,446 * | 4/1998 | Wu | 438/305 |
| 5,780,896 | 7/1998 | Ono | 257/344 |
| 5,818,092 | 10/1998 | Bai et al. | 257/388 |
| 5,847,428 | 12/1998 | Fulford, Jr. et al. | 257/344 |
| 5,895,955 | 4/1999 | Gardner et al. | 257/336 |
| 5,905,293 | 5/1999 | Jeng et al. | 257/408 |
| 5,937,315 | 8/1999 | Xiang et al. | 438/486 |
| 5,952,693 * | 9/1999 | Wu et al. | 257/344 |
| 6,005,272 * | 12/1999 | Gardner et al. | 257/344 |
| 6,005,274 * | 12/1999 | Gardner et al. | 257/411 |

OTHER PUBLICATIONS

Wolf, S.; Tauber, R. N.; Silicon Processing For the VLSI Era: vol. 1; Lattice Press; Sunset Beach, Ca.; 1986; pp. 191–195.*

Wolf, "Silicon Processing For the VLSI Era, vol. 3: the Submicron MOSFET,", Lattice Press, Sunset Beach, California, 1995, pp. 660–661.

* cited by examiner

*Primary Examiner*—Wael Fahmy
*Assistant Examiner*—Neal Berezny
(74) *Attorney, Agent, or Firm*—Kevin L. Daffer; Conley, Rose & Tayon P.C.

(57) ABSTRACT

A transistor and a method for making a transistor are described. A gate conductor is patterned over a gate dielectric upon a semiconductor substrate. Dopant impurity distributions self-aligned to the gate conductor may be introduced. A conformal oxide having thickness between about 100 angstroms and 500 angstroms is deposited over the gate conductor and substrate. The oxide is exposed to a nitrogen-bearing plasma for conversion to nitrided oxide. Anisotropic etching may then be used to form ultrathin, nitrided oxide spacers. Introduction of a second dopant impurity distribution may be performed to create source-drain regions having narrow LDD regions, and resulting decreased series resistance and increased saturated drain current. Thicker spacers or spacers combining oxide and nitrided oxide portions may firther be formed by repeated deposition of thin conformal oxides. The presence of nitrogen in nitrided oxide portions of the spacers is believed to help prevent dopant outdiffusion from adjacent silicon, prevent silicide bridging across spacers, and increase resistance of the spacers to oxide etchants.

4 Claims, 6 Drawing Sheets

ULTRATHIN, NITROGEN-CONTAINING MOSFET SIDEWALL SPACERS USING LOW-TEMPERATURE SEMICONDUCTOR FABRICATION PROCESS

BACKGROUND OF THE INVENTION

1. Field of the Invention

This invention relates to integrated circuit fabrication and, more particularly, to a method for fabricating a transistor having ultrathin nitrogen-containing sidewall spacers.

2. Description of the Related Art

Fabrication of a metal-oxide-semiconductor (MOS) integrated circuit involves numerous processing steps. Typically, a gate dielectric is formed on a semiconductor substrate which is doped with either n-type or p-type impurities. For each MOS field effect transistor (MOSFET) being formed, a gate conductor is formed over the gate dielectric, and dopant impurities are introduced into the substrate to form a source and drain. Dielectric spacers are often formed on the sidewalls of the gate conductor and used to form lightly-doped drain (LDD) portions of the source and drain. According to the conventional method of forming these LDD regions, the above-mentioned dopant impurities are introduced in two steps. A first impurity introduction is performed after gate conductor formation to form impurity distributions self-aligned to sidewalls of the gate conductor. A conformal dielectric layer, typically a silicon dioxide ("oxide") layer is subsequently blanket deposited over the semiconductor substrate and gate conductor. This oxide layer is anisotropically etched more rapidly in a vertical than a horizontal direction, so that oxide spacers are formed adjacent to the gate conductor sidewalls. A second impurity introduction is subsequently performed to form impurity distributions self aligned to lateral surfaces of the spacers. The impurity distributions formed by the second impurity introduction have higher carrier concentration and extend farther into the substrate than those formed by the first impurity introduction.

The impurity distributions formed by the first and second impurity introductions combine to form source and drain regions which include relatively lightly-doped portions, or LDD regions, underneath the sidewall spacers. Such LDD regions reduce the maximum electric field at the drain/channel interface in a MOSFET. The reduction in electric field lowers the kinetic energy gained by electrons in the MOSFET channel, thereby mitigating undesirable "hot-carrier" effects. Hot-carrier effects include avalanche breakdown at the drain/substrate junction and injection of carriers into the gate dielectric.

The alleviation of hot-carrier effects provided by the LDD regions does come at a price, however. The lightly-doped LDD regions have greater resistivity than more heavily doped portions of the source and drain, and therefore act to increase the series resistance encountered by electrons or holes traveling from the source to the drain. This increased resistance lowers the saturated drain current $I_{dsat}$ of the MOSFET, which in turn lowers the speed of the device. It is therefore believed to be important to make LDD region widths no larger than needed to achieve an acceptable level of electric field reduction. Since the lateral width of an LDD region is substantially determined by the width of the overlying spacer, spacer widths should be controlled. In particular, as overall dimensions of transistors continue to shrink, the lateral widths of sidewall spacers must decrease as well. Because MOSFET gate conductor widths are currently approaching 0.1 micron, sidewall spacer widths may comprise a significant portion of the path length between the source and drain unless spacers having thicknesses of less than about 500 angstroms can be fabricated. Although this reduction in MOSFET gate conductor width, and therefore a reduction in channel length, might be expected to result in increased electric fields in transistors, operating voltages for many devices have been decreasing as well, which opposes the effect of a shortened channel on maximum electric field. It is therefore believed that transistor performance can be enhanced using narrow spacers.

In addition to the increased series resistance which may result if spacers are made excessively wide, transistor reliability problems may be associated with sidewall spacers. As noted above, spacers are typically formed from a deposited oxide layer. Some of the dopant impurities used in transistor fabrication diffuse readily through oxide. In particular, boron is known to exhibit significant outdiffusion from silicon into overlying oxide layers during MOSFET fabrication. In a p-channel transistor, for example, boron may diffuse from the p-type source and drain into oxide sidewall spacers. This outdiffusion of boron from the substrate lowers the carrier concentration of the source and drain regions, thereby increasing series and contact resistances associated with the source and drain.

Another reliability problem which may be associated with oxide spacers is "bridging" over spacers during self-aligned silicide, or salicide, processes. Salicide processes are performed in order to provide relatively broad-area, low-resistivity (and therefore low-resistance) contacts to the source, drain, and gate of a transistor. In a salicide process, a metal film is blanket-deposited over the exposed surfaces of a transistor containing sidewall spacers, after formation of the source and drain regions. The transistor is subjected to a heating process which causes a reaction between the metal and silicon that the metal is in contact with, forming a silicide on the silicon surfaces. Unreacted metal is subsequently removed, leaving the silicide covering only the gate, source, and drain regions. In some cases, however, a silicide connection, or "bridging", can occur across oxide sidewall spacers between the gate and source or drain regions. Bridging can occur when silicon atoms from the gate, source and or drain regions diffuse into the metal overlying the sidewall spacers, so that a silicide is formed on the spacers. Titanium is a popular silicide metal because it has a very low resistance. Unfortunately, titanium salicide processes are particularly prone to bridging. The formation of ultrathin oxide spacers may further exacerbate this problem by reducing the distance between the gate and source or drain silicide regions.

It would be advantageous to develop ultrathin (less than about 500 angstroms wide) spacers to improve series resistance and saturated drain current of MOSFETs. The continual shrinking of transistor dimensions results in reduced tolerances for these dimensions. In other words, it is becoming increasingly important that device dimensions change as little as possible during the course of a fabrication process. This suggests an increased importance for low-temperature processing, so that diffusion of dopants and other atoms from their intended positions is minimized.

It would therefore be desirable to develop a process to form ultrathin MOSFET sidewall spacers. These spacers should minimize reliability problems associated with many typical oxide spacers, such as dopant diffusion and salicide bridging. Furthermore, the spacers should be fabricated using a low-temperature process, so that diffusion in the underlying transistor is minimized.

SUMMARY OF THE INVENTION

The problems outlined above are addressed herein by a technique for forming a transistor having ultrathin nitrogen-containing sidewall spacers. A gate conductor is patterned over a gate dielectric upon a semiconductor substrate. Dopant impurities of opposite type to that of the substrate may be introduced, forming dopant distributions which are self-aligned to sidewalls of the gate conductor. A conformal oxide layer having a thickness between about 100 angstroms and about 500 angstroms is subsequently deposited over or grown upon the substrate and gate conductor. The oxide layer is subsequently exposed to a nitrogen-bearing plasma. This plasma treatment is believed to result in incorporation of nitrogen into the oxide layer, to a depth of up to about 250 angstroms if an oxide layer having thickness greater than 250 angstroms is used. The incorporation of nitrogen into the oxide layer is believed to lower diffusivities of atoms in the layer, such that penetration of the nitrogen into the oxide layer is limited to about 250 angstroms.

This nitrogen incorporation, or nitrided oxide formation, is believed to confer several reliability advantages. First of all, nitrided oxide is believed to be more resistant to dopant diffusion than oxide. Spacers formed by the method recited herein are therefore believed to limit outdiffusion of impurities from the gate and/or source/drain regions. This diffusion limiting capability may be especially significant in the case of p-channel transistors, which are typically implanted with boron. As noted above, boron is known to exhibit significant outdiffusion from silicon into adjacent oxide layers during MOSFET fabrication. Furthermore, the presence of nitrogen in a sidewall spacer is believed to limit the bridging, described above, which can occur during salicide formation. Using a nitrogen ambient during the titanium silicide reaction process is known to prevent bridging during titanium salicide processes. The presence of nitrogen is believed to lower the diffusivity of silicon in titanium. It is therefore contemplated that formation of a nitrogen-containing spacer as recited herein provides a source of nitrogen to reduce bridging across the spacer.

The nitrogen-containing spacer formation recited herein is further believed to provide a reliability advantage over the alternative method of direct silicon nitride ("nitride") deposition. This advantage is related to the desirability of forming spacers using a low-temperature process. The thin oxide deposition of the method recited herein is preferably performed using plasma-enhanced chemical vapor deposition (PECVD), at a temperature between about 200° C. and about 500° C. The subsequent nitrogen-bearing plasma treatment may be performed at temperatures as low as about 300° C. The ultrathin nitrogen-containing spacers may therefore be formed using a low-temperature process. Nitride may also be deposited at low temperatures by PECVD. However, PECVD nitride typically contains large amounts (from about 10 to about 30 atomic percent) of hydrogen.

Hydrogen in dielectrics is believed to contribute to hot-electron effects in transistors by increasing the density of available trap states which can be occupied by hot electrons injected into a dielectric. Hydrogen diffuses rapidly in oxide, which is often used as a gate dielectric, and so can diffuse to silicon/oxide interfaces near the transistor channel where it may disrupt the pre-existing bonds. Although dangling bonds may be terminated with silicon-hydrogen bond formation, silicon-hydrogen bonds are weak and can easily be broken by injected hot electrons. In this way, hydrogen may exacerbate hot-electron effects. Although PECVD oxide films may also contain hydrogen, it is typically present in smaller amounts (10 atomic percent or less) than in PECVD nitride. The process recited herein is therefore believed to provide a reduced hydrogen content in the resulting spacers and thereby increased reliability as compared to deposition of nitride to form spacers.

Subsequent to the oxide deposition and nitrogen-bearing plasma treatment described above, substantially horizontal portions of the nitrided oxide film are removed, to form ultrathin spacers on sidewalls of the gate conductors. The small width of each spacer is believed to result in a corresponding small width of an LDD region which may be formed below the spacer. Narrow LDD regions are believed to result in lowered series resistance and increased saturated drain current for the transistor. The composition of the ultrathin spacers may vary depending on the thickness of the deposited oxide layer and details of the plasma treatment. For example, if the oxide layer has a thickness of about 250 angstroms or less, and is exposed to the nitrogen-bearing plasma for a sufficient time, nitrogen will be incorporated into the entire oxide layer. On the other hand, if the oxide layer has a thickness of greater than 250 angstroms, or if a thinner oxide layer is exposed to the plasma for a sufficiently short time, nitrogen will be incorporated into only an outer portion of the oxide layer. Retaining a portion of spacer formed from oxide which is substantially free of nitrogen may be advantageous because the relative permittivity of oxide is lower than that of nitrided oxide. Inclusion of a lower-permittivity portion in the spacer may reduce the effects of fringing fields and parasitic capacitance between the gate and source/drain regions. Further transistor fabrication, which may include dopant impurity introduction and/or salicide formation, is typically performed subsequent to spacer formation.

In an alternative embodiment of the method recited herein, an additional oxide layer may be deposited subsequent to plasma treatment of a previously deposited oxide layer. The additional oxide may subsequently be exposed to the nitrogen-bearing plasma. In this way, nitrided oxide spacers having a width of greater than about 250 angstroms may be formed. In another embodiment, deposition of additional oxide layers could be used to form spacers containing alternating nitride-free oxide and nitrided oxide portions. In embodiments for which additional oxide layers are deposited, removal of horizontal portions of the layers may be performed either before deposition of each additional oxide layer, or after more than one oxide layer has been deposited. Although a single removal process, typically by anisotropic etching, after all oxide layers are deposited saves process steps, etching of individual layers may result in variation of the shapes of the layer portions which remain in the finished spacer. The ability to control these portion shapes may be useful, particularly when different layer compositions are combined to form the spacers.

Dopant impurity introduction may be performed at various stages in the process recited herein, including before oxide layer deposition, after etching to form sidewall spacers, and through thin oxide and/or nitrided oxide layers before etching. Introduction of impurities through a nitrided oxide layer by, for example, ion implantation may be advantageous for impurities such as boron, commonly used in p-channel transistors, which outdiffuse from silicon into overlying layers. As discussed above, nitrided oxide is an effective diffusion barrier and is believed to prevent outdiffusion of boron and other impurities from a substrate. In embodiments for which additional oxide layers are deposited, dopant impurities, if introduced, may be introduced before or after additional oxide layer deposition. Impurity introduction between depositions of successive oxide layers may be used, for example, to create graded source/drain impurity distributions. Alternatively, the lightly doped impurity introduction which is conventionally self-aligned to the gate conductor in an LDD process may be offset from the gate conductor by the width of one or more thin oxide spacer portions. An additional oxide layer may be formed subsequent to this impurity introduction for masking of the more heavily-doped impurity introduction. Such a procedure may be useful in limiting shortening of the channel by diffusion of impurities during subsequent processing steps. In other words, impurities may diffuse into the thin region under the offsetting spacer portion without diffusing into the actual channel. After introduction of the more heavily doped impurity distribution in an LDD process, one or more additional spacer portions may be formed so that the spacers in the finished transistor extend beyond the edge of the more heavily-doped distribution. This embodiment may be useful in providing a wider spacer to mask a subsequent salicide process. The reliability of the salicide process may be enhanced by the wider spacer, while the narrow LDD regions are maintained, thereby providing a low series resistance for the transistor.

As is partially illustrated by the above embodiments, the method recited herein may allow substantial flexibility in tailoring the thickness and composition of ultrathin spacers. Multiple oxide layers may be deposited and converted, either partially or completely, to nitrided oxide. The ability to form extremely thin oxide layers and spacers using the method recited herein is believed to allow the formation of spacers which may contain multiple oxide and/or nitrided oxide layers without having prohibitively large lateral widths.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
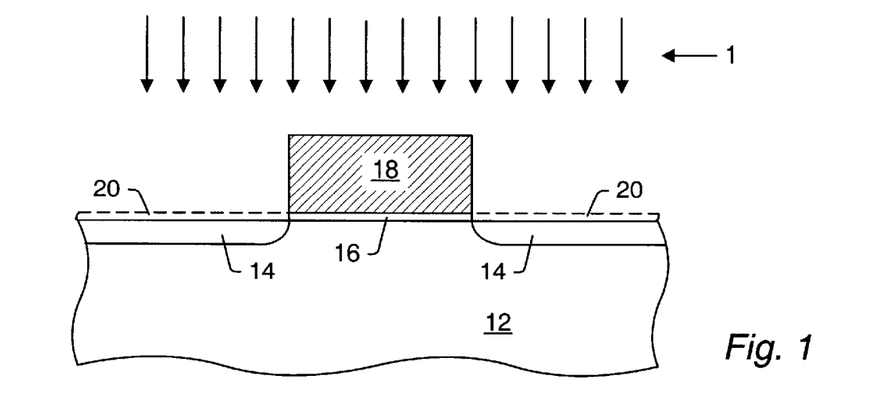
FIG. 1 is a partial cross-sectional view of a semiconductor topography including a semiconductor substrate upon which a gate dielectric is formed and a gate conductor is patterned and into which impurity distributions are introduced.

Turning to the drawings, FIG. 1 illustrates a partial cross-section of a semiconductor topography including a silicon gate conductor 18 and a gate dielectric 16 arranged above semiconductor substrate 12. Impurity distributions 14 may be introduced into substrate 12, self-aligned to gate conductor 18 using impurity introduction process 1. In this case, gate dielectric portions 20 (shown by dashed lines) not covered by gate conductor 18 have been removed. Alternatively, portions 20 may be left in place for subsequent processing steps, as long as they are removed before making contact to the source and drain regions.

Semiconductor substrate 12 is preferably monocrystalline silicon, and is doped either n-type or p-type. More specifically, substrate 12 may be an epitaxial silicon layer grown on a monocrystalline silicon substrate, or an n-type or p-type well region formed in a monocrystalline silicon substrate. Although not shown, dielectric isolation regions may be formed which separate impurity regions 14 from source and drain regions of adjacent transistors. One method by which such isolation regions may be formed is the formation of trenches which are subsequently filled with a deposited dielectric, while another method which may be used is local oxidation of the substrate, using silicon nitride to mask the active regions in which transistors are to be formed. Gate dielectric 16 is preferably grown by heating substrate 12 to a temperature of greater than about 700° C. in an oxidizing ambient to grow oxide. Other gate dielectrics may be used, however, including silicon nitride, nitrided oxide, silicon oxynitride, and deposited oxide. Silicon gate conductor 18 is preferably a polysilicon gate conductor patterned from a polysilicon layer which is deposited using chemical vapor deposition (CVD) of silicon from, for example, a silane source. Such a CVD process may alternatively result in an amorphous silicon layer, particularly if low substrate temperatures are used. An amorphous silicon layer may also be patterned to form gate conductor 18, and other materials which can withstand subsequent processing (such as that needed to form source and drain regions) may also be used.

Impurity introduction process 1 is preferably an ion implantation process. For formation of an LDD region, a typical implant dose may be in a range from about $8 \times 10^{14}$ $cm^{-2}$ to about $5 \times 10^{15}$ $cm^{-2}$, and the implant energy may be in a range from about 600 eV to 5 keV. Impurity distributions 14 are of opposite type to that of substrate 12. For an n-channel transistor, for example, substrate 12 is p-type and distributions 14 are n-type. Typical n-type dopants include arsenic, phosphorus and antimony, while boron is a typical p-type dopant. If source and drain impurity distributions 14 are introduced by ion implantation, a subsequent anneal is performed in order to activate the impurities and repair damage to substrate 12.

Figure 2:
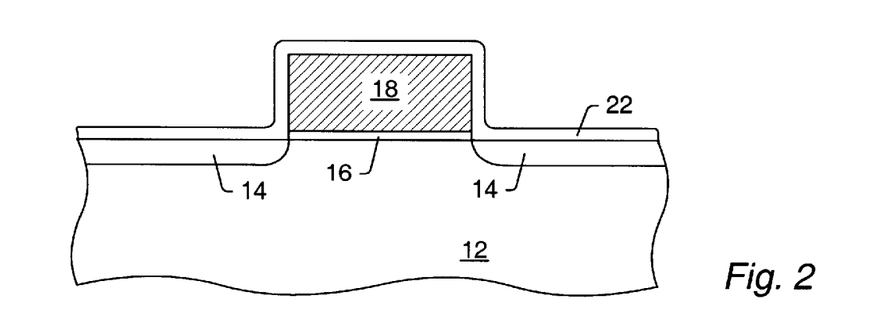
FIG. 2 is a partial cross-sectional view of the semiconductor topography wherein a thin conformal oxide is formed over the gate conductor and substrate, subsequent to the impurity introduction of FIG. 1.

Thin conformal oxide 22, having a thickness of between about 100 angstroms and 500 angstroms, is subsequently formed over gate conductor 18 and substrate 12, as shown in FIG. 2. Oxide 22 is preferably deposited by PECVD at a temperature of about 400° C. using a silane source. This technique is believed to result in a low-temperature, conformal, high-quality oxide. PECVD using a silane source can also be carried out at temperatures ranging between about 200° C. and about 500° C. Decomposition of tetraethyl orthosilicate (TEOS) may also be performed in a PECVD reactor to deposit oxide 22, but controllable ultrathin layers are believed to be more difficult to deposit with TEOS than with a silane-based deposition. Other techniques which may be suitable for deposition of oxide 22 include low-pressure CVD (LPCVD) and atmospheric pressure (CVD) (APCVD). However, LPCVD is believed to generally require higher substrate temperatures than PECVD, and APCVD is believed to result in less conformal films than those deposited by PECVD.

If gate conductor 18 is formed from silicon, oxide 22 may also be thermally grown, in a manner similar to that described for gate dielectric 16 above. Because thermal oxide growth is a higher-temperature process than oxide deposition by PECVD, thermal growth of oxide 22 may be most suitable for embodiments in which impurity introduction 1 is delayed until after formation of one or more spacer portions. In this way, impurity distributions 14 are not present during the thermal growth of oxide 22 and are not subject to the diffusion which may result. Thermal growth of oxide 22 consumes some of silicon gate conductor 18. For example, if oxide 22 is grown 200 angstroms thick, about 88 angstroms of silicon is consumed on each side of the gate, so that the gate width decreases by about 176 angstroms. Thermal growth of oxide 22 may be useful in cases for which a smaller gate width than that originally patterned is desired.

Figure 3:
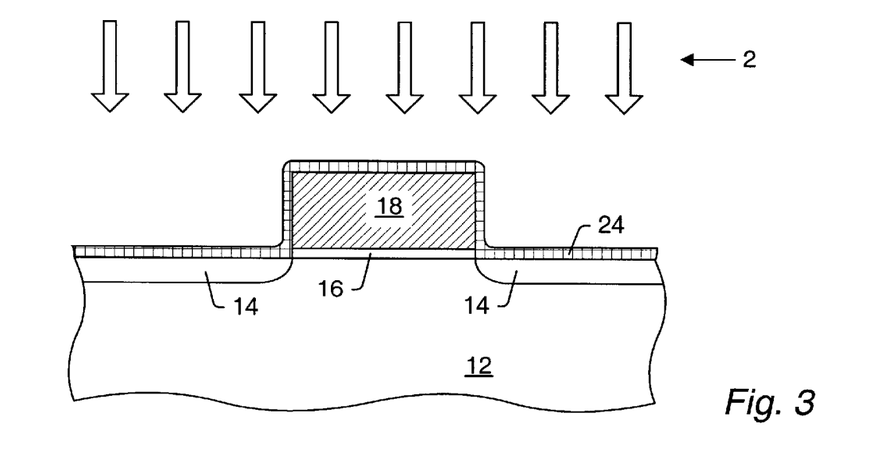
FIG. 3 is a partial cross-sectional view of the semiconductor topography wherein the oxide is exposed to a nitrogen-bearing plasma to form a nitrided oxide, subsequent to the oxide formation of FIG. 2.

Turning now to FIG. 3, oxide 22 is exposed to plasma treatment 2, such that nitrided oxide 24 is formed. The objective of plasma treatment 2 is to expose oxide 22 to nitrogen ions and radicals which may diffuse into oxide 22 and convert at least a portion of it into a nitrided oxide containing silicon, nitrogen, and oxygen. The increased energy and reactivity of the excited nitrogen ions and radicals as compared to that of non-excited nitrogen-containing molecules allows the nitrided oxide to be formed at lower substrate temperatures than can be used for thermal nitridation of an oxide without using a plasma. Substrate temperatures for plasma treatment 2 may range from about 300° C. to about 700° C. A nitrogen-bearing plasma is formed by creating a glow discharge in a nitrogen-bearing gas. The glow discharge is formed by applying a voltage, typically a radio frequency (RF) voltage having a frequency of up to about 13.5 MHz, between two electrodes in the vicinity of the nitrogen-bearing gas. For example, if the treatment is performed in a deposition system utilizing a showerhead positioned above a semiconductor substrate to introduce reactant gases, the RF field may be established between the showerhead and a conductive substrate mounting surface.

The electrode configuration for plasma treatment 2 is preferably such that the DC potential of substrate 12 is substantially equal to that of the plasma. This configuration minimizes sputtering of oxide 22 during plasma treatment 2, and may be realized using an inductively-coupled DC ground connection to the powered electrode. To further minimize possible damage to oxide 22 during plasma treatment 2, a remote plasma configuration may be used in which substrate 12 is farther removed from the glow discharge. Nitrogen-bearing gases which may be used in plasma treatment 2 include ammonia ($NH_3$), molecular nitrogen ($N_2$), atomic nitrogen (N), nitric oxide (NO) and nitrous oxide ($N_2O$). Oxygen-containing gases such as NO and $N_2O$ may cause additional oxide growth during plasma treatment 2. Depending on the specific plasma used and the degree of nitridation desired, plasma treatment 2 may have a duration of between about 30 seconds and about 10 minutes. In the embodiment illustrated in FIG. 3, all of oxide 22 is converted to nitrided oxide 24. This may be achieved in embodiments for which oxide 22 has a thickness of less than about 250 angstroms.

Figure 4:
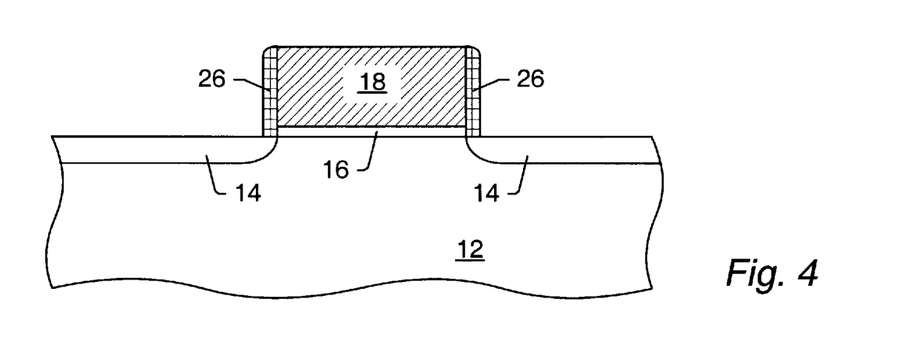
FIG. 4 is a partial cross-sectional view of the semiconductor topography wherein portions of the nitrided oxide are removed to form sidewall spacers, subsequent to the plasma exposure of FIG. 3.
Figure 5:
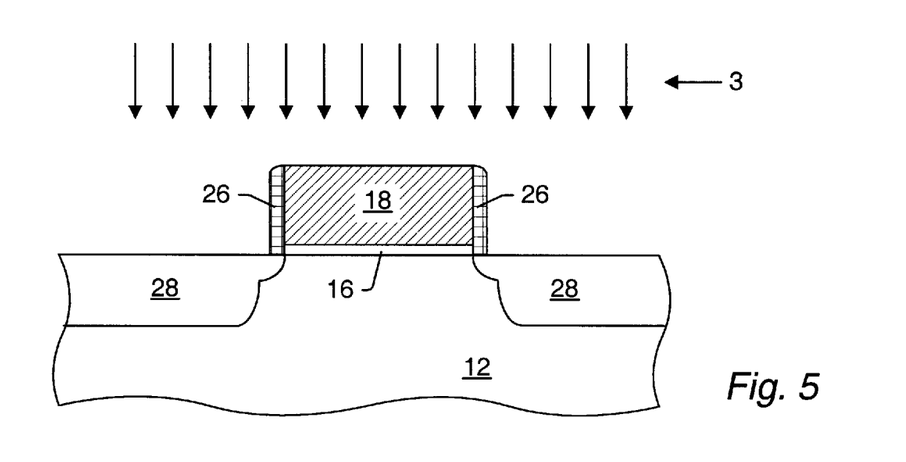
FIG. 5 is a partial cross-sectional view of the semiconductor topography wherein a second impurity distribution is introduced, subsequent to the spacer formation of FIG. 4.

Portions of nitrided oxide 24 are subsequently removed to form spacers 26, as shown in FIG. 4. The removal is preferably accomplished using an anisotropic etching process which etches more rapidly in a vertical than in a horizontal direction. Impurity introduction process 3 may subsequently be performed to complete source and drain regions 28, as shown in FIG. 5. Impurity introduction 3 is preferably an ion implantation process having higher dose and higher energy than those of impurity introduction 1 in FIG. 1. Source and drain regions 28 thereby include deeper, more heavily doped regions aligned with exposed lateral sidewalls of spacers 26, and LDD regions below spacers 26. The small lateral width of spacers 26 results in small LDD region widths, which are believed to provide reduced series resistance, increased saturated drain current, and increased speed to the transistor. The nitrogen content in nitrided oxide spacers 26 is believed to provide reliability advantages, including a reduction of dopant outdiffusion from the gate and source/drain regions.

Figure 6:
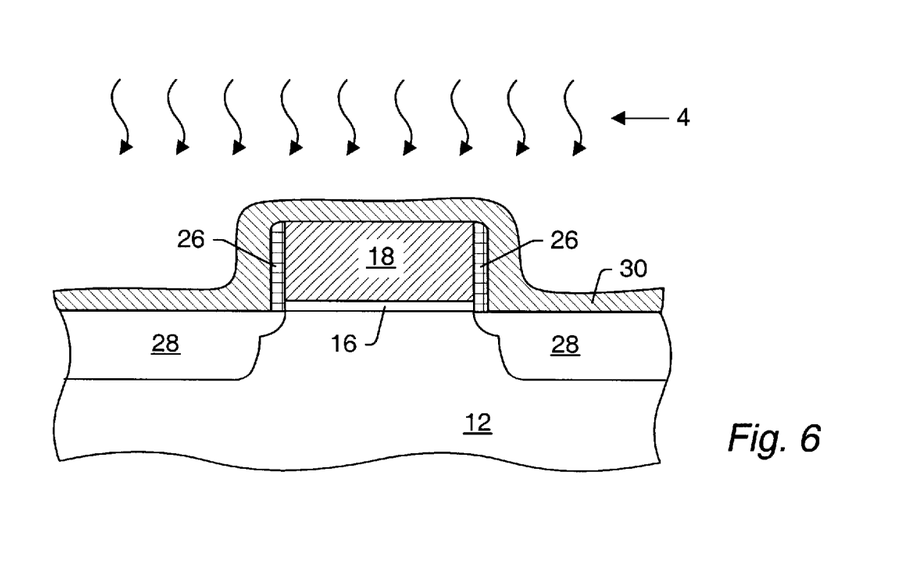
FIG. 6 is a partial cross-sectional view of the semiconductor topography wherein a metal layer is deposited over the topography and reacted with underlying silicon, subsequent to the impurity introduction of FIG. 5.
Figure 7:
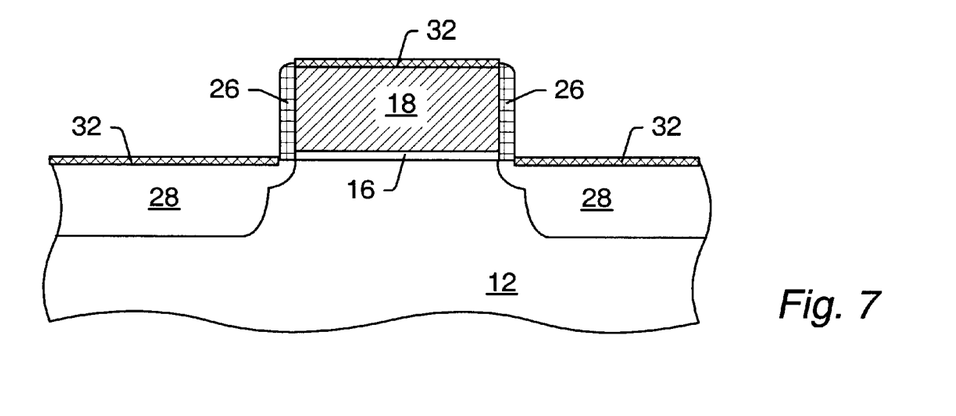
FIG. 7 is a partial cross-sectional view of the semiconductor topography wherein unreacted metal is removed, subsequent to the reaction of FIG. 6.

Metal layer 30 may subsequently be deposited over gate conductor 18, spacers 26 and substrate 12, as shown in FIG. 6. Thermal process 4 is used to react portions of metal layer 30 with underlying silicon. Metal layer 30 is preferably formed from titanium or cobalt, but may include other metals with which silicides may be formed, such as platinum, tungsten, tantalum, palladium, or nickel. Thermal process 4 preferably includes heating substrate 12 to a temperature greater than about 600° C. in an inert ambient such as nitrogen, argon, or forming gas (nitrogen with 5% hydrogen). The heating may be performed in a rapid thermal annealing system or in a standard furnace. Portions of metal layer 30 which are in contact with silicon react with the silicon to form silicide. Unreacted metal is subsequently removed, forming the transistor shown in FIG. 7. This removal is typically accomplished using a wet etch which is selective to the unreacted metal over silicide, silicon, and oxide. A suitable etch for unreacted titanium, for example, may be a 5:1:1 mixture of water, 30% hydrogen peroxide, and ammonium hydroxide. A suitable etch for unreacted cobalt may be a 3:1 mixture of hydrochloric acid and 30% hydrogen peroxide. Removal of unreacted portions of metal layer 30 leaves silicides 32 on upper surfaces of gate conductor 18 (if a silicon gate conductor is used) and source and drain regions 28. The nitrogen content in nitrided oxide spacers 26 is believed to inhibit possible silicide bridging during reaction by thermal process 4.

Figure 8:
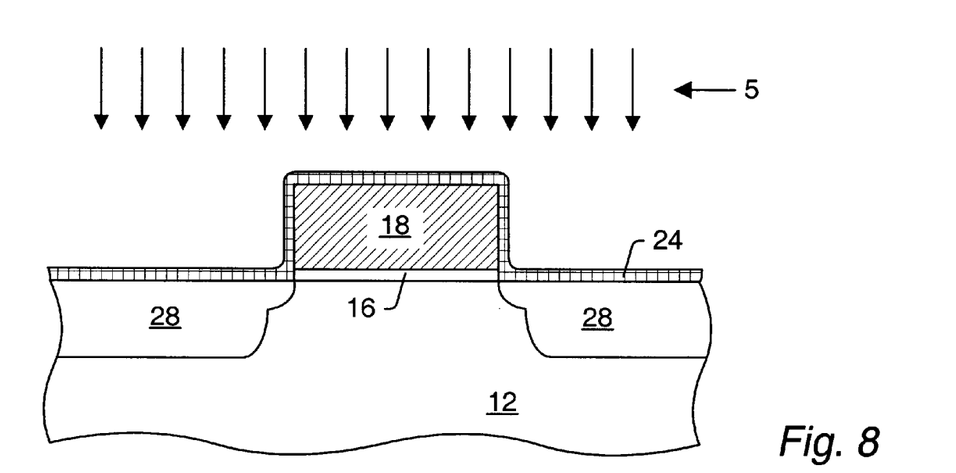
FIG. 8 is a partial cross-sectional view of the semiconductor topography in an alternative embodiment, wherein the second impurity distribution is introduced through the nitrided oxide, subsequent to the plasma treatment of FIG. 3 and prior to the spacer formation of FIG. 4.

In an alternate embodiment shown in FIG. 8, impurity introduction 5 may be performed through nitrided oxide 24, after plasma treatment 2 shown in FIG. 3 and before the formation of spacers 26 shown in FIG. 4. In this embodiment, impurity introduction 5 would be performed instead of impurity introduction 3 shown in FIG. 5. Because gate conductor 18 is typically about 0.15 microns thick, impurity introduction 5 can be designed to penetrate the horizontal portions of nitrided oxide 24 while being masked by the vertical portions. Impurity introduction 5 is preferably an ion implantation process similar to impurity introduction 3 discussed in the description of FIG. 5 above. As such, an annealing step is performed subsequent to the implantation to activate the implanted dopants and repair lattice damage. This embodiment is believed to inhibit outdiffusion of dopants during this anneal by providing a nitrided oxide adjacent to upper surfaces of source and drain regions 28.

Figure 9:
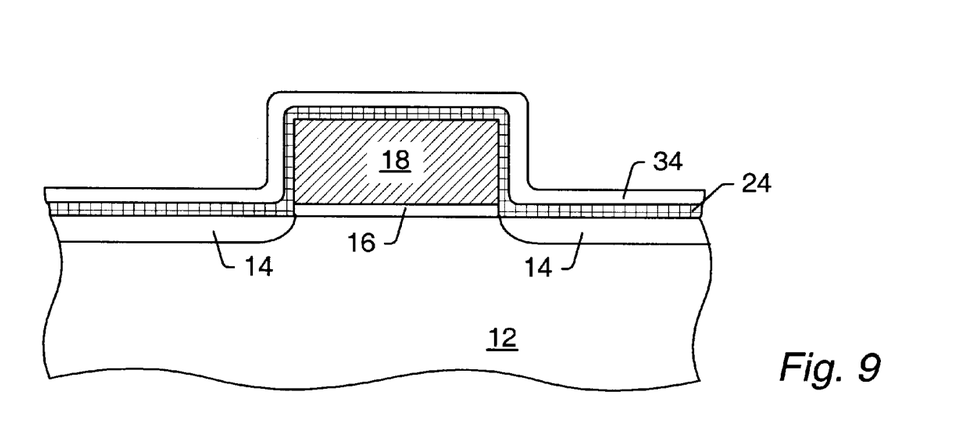
FIG. 9 is a partial cross-sectional view of the semiconductor topography in an alternative embodiment, wherein an additional conformal oxide is deposited over the nitrided oxide, subsequent to the plasma treatment of FIG. 3.
Figure 10:
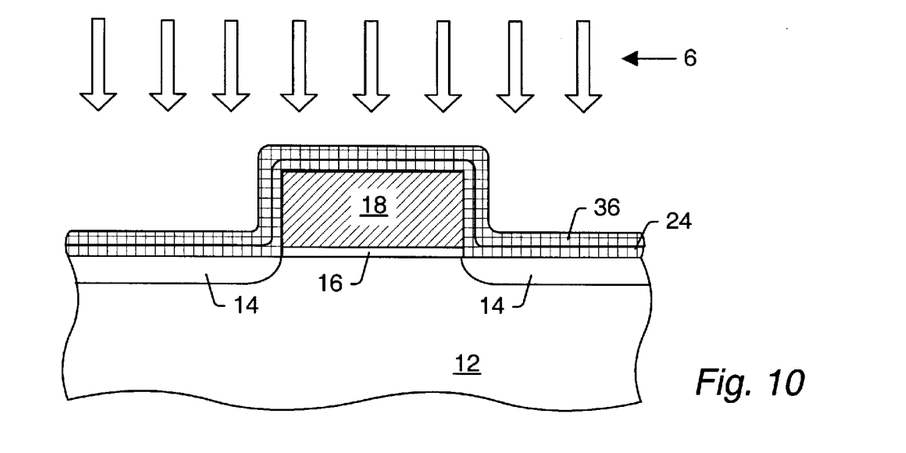
FIG. 10 is a partial cross-sectional view of the semiconductor topography wherein the additional oxide is exposed to a nitrogen-bearing plasma to form a nitrided oxide, subsequent to the deposition of FIG. 9.
Figure 11:
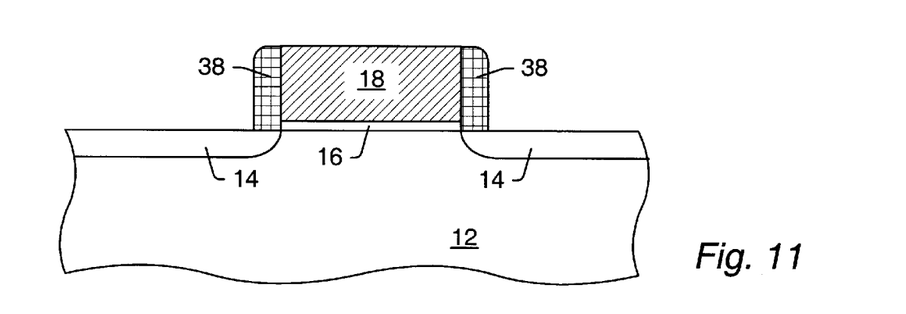
FIG. 11 is a partial cross-sectional view of the semiconductor topography wherein portions of the oxide and additional oxide are removed to form spacers, subsequent to the plasma treatment of FIG. 10.

Turning now to FIG. 9, an alternate embodiment is shown in which additional oxide 34 is deposited subsequent to formation of nitrided oxide 24. As in the case of oxide 22 of FIG. 2, oxide 34 is preferably deposited by PECVD using a silane source. Thermal growth of oxide 34 is not an option since it is not formed upon a silicon layer. Oxide 34 may subsequently be subjected to plasma treatment 6 to form nitrided oxide 36 above nitrided oxide 24, as shown in FIG. 10. Plasma treatment 6 is similar to plasma treatment 2 discussed in the description of FIG. 3 above. In the embodiment of FIG. 10, all of oxide 34 is converted to nitrided oxide, so that nitrided oxides 24 and 36 combine to form a nitrided oxide layer which may have a thickness of up to about 500 angstroms. Portions of this thicker nitrided oxide layer may be removed to form spacers 38, as shown in FIG. 11. The spacer formation is performed in a similar manner to that of FIG. 4. Spacers 38 may be up to about 500 angstroms wide, while spacers 26 in FIG. 4 are limited to a width of about 250 angstroms, because of the limited diffusivity of nitrogen in a single nitrided oxide layer. The procedure of FIGS. 9 and 10 may be repeated with additional oxides, to form even wider spacers. Additional oxides may be deposited before etching to form spacers, as shown in FIGS. 9–11, or spacer formation may be done for each oxide layer in turn.

Figure 12:
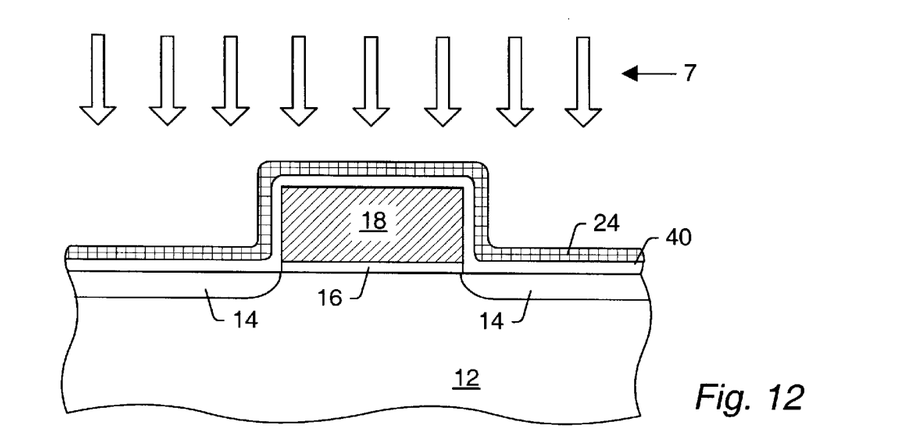
FIG. 12 is a partial cross-sectional view of the semiconductor topography in an alternative embodiment, wherein the oxide is exposed to a nitrogen-bearing plasma treatment such that only an outer portion is converted to nitrided oxide, subsequent to the deposition of FIG. 2.
Figure 13:
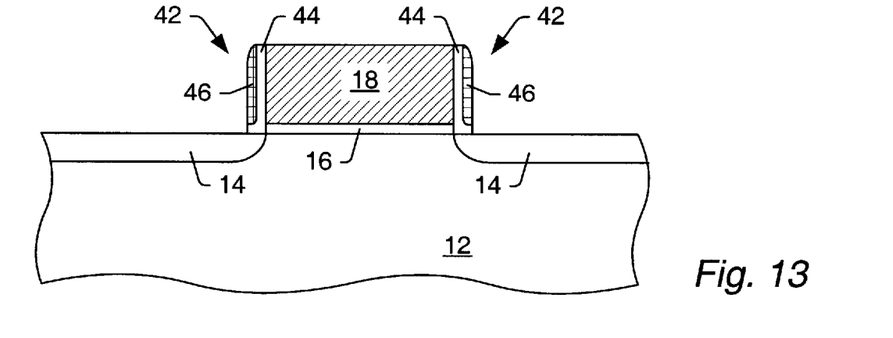
FIG. 13 is a partial cross-sectional view of the semiconductor topography wherein portions of the oxide are removed to form spacers, subsequent to the plasma exposure of FIG. 12.

Turning to FIG. 12, an alternate embodiment is shown in which only an outer portion of oxide 22 is converted to nitrided oxide. Plasma treatment 7 converts oxide 22, as shown in FIG. 2, to nitrided oxide 24 and substantially nitrogen-free oxide 40. One case in which this incomplete conversion may occur is that for which oxide 22 is more than about 250 angstroms thick. Even for smaller thicknesses of oxide 22, incomplete conversion may occur if plasma treatment 7, which is similar to plasma treatments 2 and 6 described above, is carried out for an insufficient length of time to convert all of layer 22. The time needed to convert an oxide layer to nitrided oxide depends upon factors such as the particular nitrogen species in the plasma and the substrate temperature used. an Removal of portions of nitrided oxide 24 and oxide 40 to form spacers, as shown in FIG. 13, results in spacers containing both oxide and nitrided oxide portions. Spacers 42 in FIG. 13 include oxide portions 44 and nitrided oxide portions 46. Oxide portions 44 may be advantageous from the standpoint that they have lower permittivity than that of nitrided oxide. This may reduce fringing electric fields in spacers 42 and capacitive coupling between gate conductor 18 and source and drain regions to be completed during subsequent processing.

Figure 14:
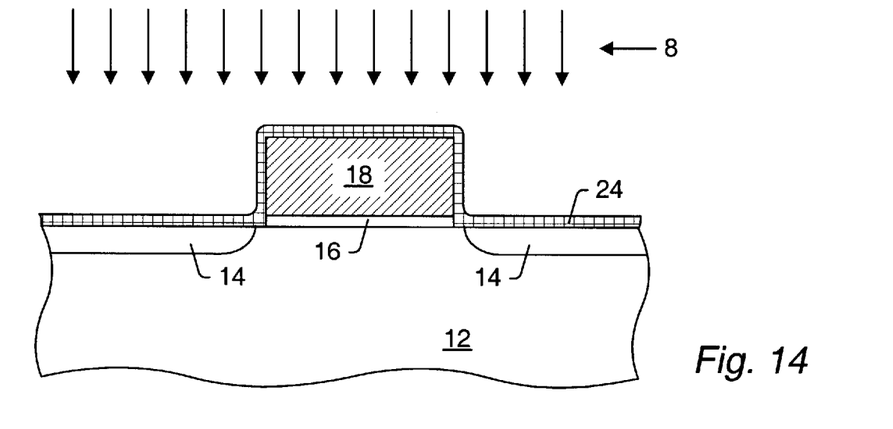
FIG. 14 is a partial cross-sectional view of the semiconductor topography in an alternative embodiment, wherein a first impurity distribution is introduced after formation of a nitrided oxide.

As noted above, the method recited herein provides substantial flexibility in spacer thickness and composition, and in doping profile under the spacers. An embodiment of the method illustrating formation of a transistor having multilayer, dual-composition spacers is shown in FIGS. 14–18. In FIG. 14, an embodiment is shown in which nitrided oxide 24 is formed over gate conductor 18 and substrate 12 before introduction of impurity distributions 47, using impurity introduction 8. Impurity distributions 47 are similar to impurity distributions 14 in, for example, FIG. 1. This embodiment allows impurity distribution 47 to be activated in the presence of an overlying nitrided oxide layer, which may suppress outdiffuision of impurities from distribution 47. Furthermore, the edges of impurity distributions 47 are offset from sidewalls of gate conductor 18 by the width of a vertical portion of nitrided oxide 24. This offset may allow impurities from distributions 47 to diffuse during subsequent process steps without shortening the channel below gate conductor 18. Impurity introduction 8 is preferably an ion implantation, and is similar to impurity introduction 1 as discussed in the description of FIG. 1 above.

Figure 15:
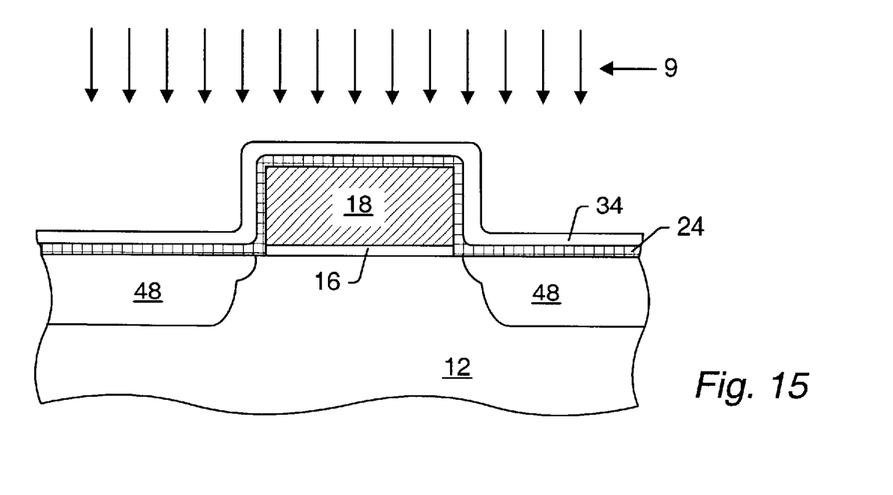
FIG. 15 is a partial cross-sectional view of the semiconductor topography wherein a second oxide is deposited over the nitrided oxide, and a second impurity distribution is introduced, subsequent to the impurity introduction of FIG. 14.
Figure 16:
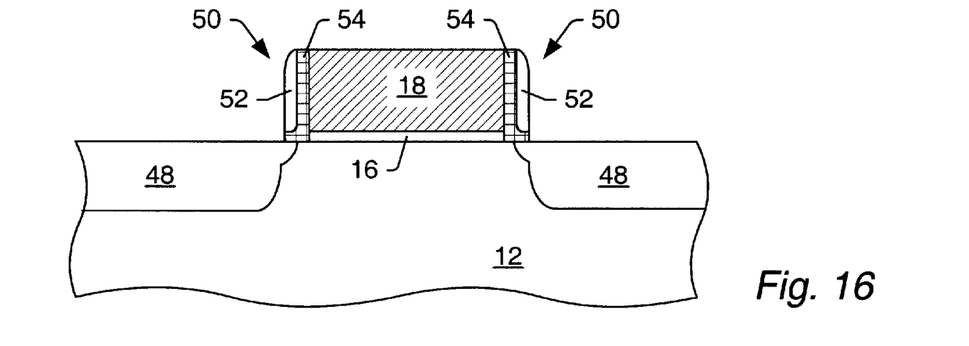
FIG. 16 is a partial cross-sectional view of the semiconductor topography wherein portions of the nitrided oxide and second oxide are removed to form spacers, subsequent to the impurity introduction of FIG. 15.
Figure 17:
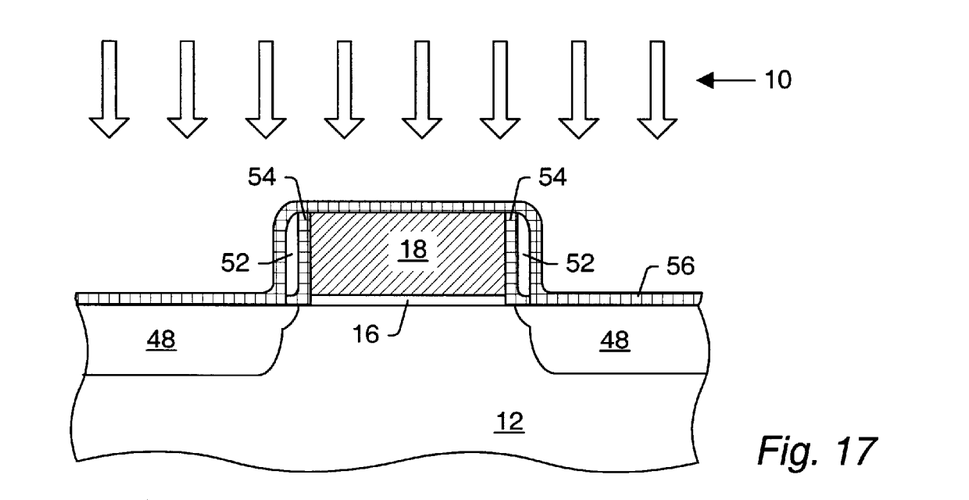
FIG. 17 is a partial cross-sectional view of the semiconductor topography wherein a third oxide is deposited and exposed to a nitrogen-bearing plasma to form a second nitrided oxide, subsequent to the spacer formation of FIG. 16.

Additional oxide 34 may subsequently be deposited over nitrided oxide 24, as shown in FIG. 15. Deposition of additional oxide 34 is discussed in the description of FIG. 9 above. Impurity introduction 9 shown in FIG. 15 is similar to impurity introduction 3 shown in FIG. 5. The distribution formed by impurity introduction 9 combines with distribution 47 of FIG. 14 to form source and drain regions 48. Source and drain regions 48 each contain an LDD region substantially aligned beneath a vertical portion of additional oxide 34. Portions of nitrided oxide 24 and additional oxide 34 may be subsequently removed to form spacers 50 containing oxide portions 52 and nitrided oxide portions 54, as shown in FIG. 16. The spacers are preferably formed using an anisotropic etch process. Subsequent to this spacer formation, a third oxide may be deposited over gate conductor 18, spacers 50, and substrate 12. This oxide may then be converted to nitrided oxide 56 using plasma treatment 10, as shown in FIG. 17. Plasma treatment 10 is similar to other plasma treatments described above, such as treatment 6 in FIG. 10 or treatment 2 in FIG. 3.

Figure 18:
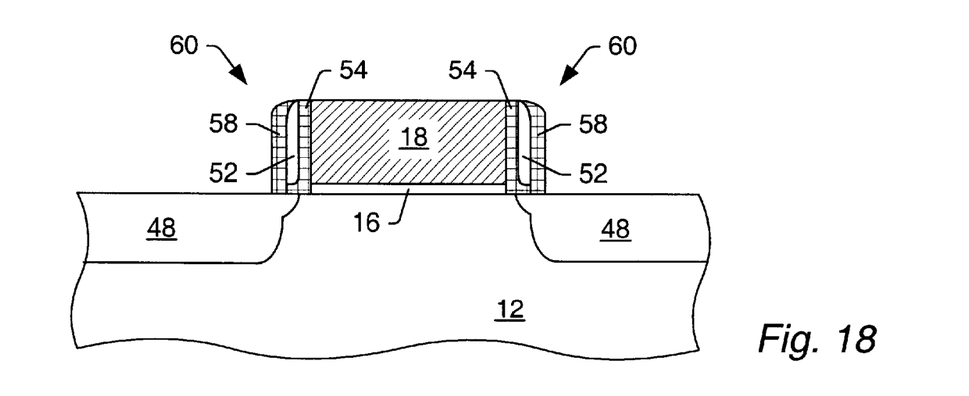
FIG. 18 is a partial cross-sectional view of the semiconductor topography wherein portions of the second nitrided oxide are removed to form additional portions of the spacers, subsequent to the plasma treatment of FIG. 17.

Portions of nitrided oxide 56 may be subsequently removed, preferably using an anisotropic etch process, as shown in FIG. 18. Remaining portions 58 of nitrided oxide 56 combine with oxide portions 52 and first nitrided oxide portions 54 to form compound spacers 60. The nitrogen present in nitrided oxide portions 58 is believed to help prevent silicide bridging across spacers 60 during salicide processes. Nitrided oxide portions 58 may also make spacers 60 more resistant to etches which attack oxide. For example, spacers 60 may be more resistant to an etchant used to form a contact hole in an overlying oxide than an oxide spacer would be. The nitrogen in nitrided oxide portions 54 is believed to help minimize dopant diffusion into the spacers from adjacent silicon gate and source/drain regions. Oxide regions 52, which form much of the central regions of spacers 60, have a lower permittivity than the surrounding nitrided oxide portions. As such, oxide regions 52 are believed to reduce fringing fields and capacitive coupling associated with spacers 60.

The configuration of spacers 60 is achieved in part by selecting an appropriate sequence of layer deposition and etching to form spacers. For example, oxide 34 is deposited over nitrided oxide 24 before spacer formation, so that resulting spacers 50 include nitrided oxide along their lower surfaces. If nitrided oxide 24 were first etched to form spacers before deposition of oxide 34, the resulting spacers would contain an oxide portion extending down to substrate 12. It is desirable to have nitrided oxide, rather than nitrogen-free oxide, along all spacer surfaces adjacent to silicon, so that dopant diffusion from the silicon may be inhibited. On the other hand, spacer formation from oxide 34 and nitrided oxide 24 is performed before formation of second nitrided oxide 56. This allows formation of a nitrided oxide spacer portion extending along substantially the entire exposed surface of oxide portion 52, so that oxide portion 52 is substantially surrounded by nitrided oxide. If nitrided oxide 56 were formed over oxide 34 before the spacer formation of FIG. 16, the second nitrided oxide portion of the final spacer would rest above an "L"-shaped oxide portion, so that more of the oxide surface would be exposed. It is desirable to instead have nitrided oxide along exposed spacer surfaces to protect against silicide bridging and etchant damage.

It will be appreciated to those skilled in the art having the benefit of this disclosure that this invention is believed to provide a transistor having ultrathin, nitrided-oxide-containing spacers, and a method for forming this transistor. It will be further appreciated to those skilled in the art having the benefit of this disclosure that this invention is believed to provide a transistor having multilayer spacers containing oxide and/or nitrided oxide portions, and a method for forming this transistor. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A transistor, comprising:
   a gate conductor arranged above a semiconductor substrate and between a pair of opposed sidewall surfaces; and
   a spacer arranged laterally adjacent to each of said pair of opposed sidewall surfaces, wherein said spacer has a lateral width of no more than about 500 angstroms and comprises:
      a first nitrided oxide layer comprising a substantially horizontal nitrided oxide portion and a substantially vertical nitrided oxide portion, wherein a lower surface of the horizontal nitrided oxide portion forms a lower surface of the spacer, and wherein the vertical nitrided oxide portion extends across one of the sidewall surfaces;
      an oxide layer substantially free of nitrogen comprising a substantially vertical oxide layer, wherein the oxide layer is adjacent to an exposed lateral surface of the vertical nitrided oxide portion, and wherein the oxide layer is adjacent to an exposed upper surface of the horizontal nitrided oxide portion; and
      a second nitrided oxide layer comprising a substantially vertical nitrided oxide layer, wherein the second nitrided oxide layer extends across an exposed lateral surface of the oxide layer and an exposed lateral surface of the horizontal nitrided oxide portion, and wherein the oxide layer and second nitrided oxide layer are each tapered at an end farthest from the semiconductor substrate and curved toward the gate conductor such that the oxide layer is substantially surrounded by a combination of the first and second nitrided oxide layers.

2. The transistor as recited in claim 1, further comprising a lightly-doped drain (LDD), wherein the LDD region is formed below the spacer, and wherein the lateral width of the LDD region is commensurate with the lateral width of the spacer.

3. A transistor, comprising:
   a gate conductor arranged above a semiconductor substrate and between a pair of opposed sidewall surfaces; and
   a spacer, wherein said spacer comprises:
      a first nitrided oxide layer comprising a substantially horizontal nitrided oxide portion and a substantially vertical nitrided oxide portion, wherein a lower surface of the horizontal nitrided oxide portion forms a lower surface of the spacer, wherein the lower surface of the horizontal nitrided oxide portion has a width of no more than about 500 angstroms, and wherein the vertical nitrided oxide portion extends across one of the sidewall surfaces;
      an oxide layer substantially free of nitrogen comprising a substantially vertical oxide layer, wherein the oxide layer is adjacent to an exposed lateral surface of the vertical nitrided oxide portion, and wherein the oxide layer is adjacent to an exposed upper surface of the horizontal nitrided oxide portion; and
      a second nitrided oxide layer comprising a substantially vertical nitrided oxide layer, wherein the second nitrided oxide layer extends across an exposed lateral surface of the oxide layer and an exposed lateral surface of the horizontal nitrided oxide portion, and wherein the oxide layer and second nitrided oxide layer are each tapered at an end farthest from the semiconductor substrate and curved toward the gate conductor such that the oxide layer is substantially surrounded by a combination of the first and second nitrided oxide layers.

4. The transistor as recited in claim 3, furher comprising a lightly-doped drain (LDD) region, wherein the LDD region is formed below the spacer, and wherein the lateral width of the LDD region is commensurate with the lateral width of the spacer.

* * * * *

UNITED STATES PATENT AND TRADEMARK OFFICE
CERTIFICATE OF CORRECTION

PATENT NO. : 6,323,519 B1
DATED : November 27, 2001
INVENTOR(S) : Gardner et al.

It is certified that error appears in the above-identified patent and that said Letters Patent is hereby corrected as shown below:

<u>Column 12, claim 4,</u>
Line 61, after the phrase "as recited in claim 3," please delete the word "furher" and substitute therefor -- further --.

Signed and Sealed this

Nineteenth Day of March, 2002

Attest:

JAMES E. ROGAN
Attesting Officer     Director of the United States Patent and Trademark Office